United States Patent [19]

Nakatani

[11] 4,455,502
[45] Jun. 19, 1984

[54] RECTANGULAR PIEZOELECTRIC RESONATOR WITH OFFSET SLOT

[75] Inventor: Hiroshi Nakatani, Kanazawa, Japan

[73] Assignee: Murata Manufacturing Co., Ltd., Nagaokakyo, Japan

[21] Appl. No.: 512,124

[22] Filed: Jul. 8, 1983

[30] Foreign Application Priority Data

Jul. 9, 1982 [JP] Japan .......................... 57-104645[U]

[51] Int. Cl.³ ........................................... H01L 41/08
[52] U.S. Cl. .................................... 310/368; 310/367; 310/366
[58] Field of Search ............................... 310/368–371, 310/366

[56] References Cited

U.S. PATENT DOCUMENTS

| | | | |
|---|---|---|---|
| 2,018,246 | 10/1935 | Beard | 310/368 |
| 2,543,500 | 2/1951 | Kettering et al. | 310/367 X |
| 3,036,231 | 5/1962 | Henry | 310/367 X |
| 3,421,109 | 1/1969 | Wiggins et al. | 310/367 X |

FOREIGN PATENT DOCUMENTS 832608  4/1960  United Kingdom ............... 310/368

Primary Examiner—Mark O. Budd
Attorney, Agent, or Firm—Wenderoth, Lind & Ponack

[57] ABSTRACT

This disclosure is directed to an improved strip type or rectangular type piezoelectric resonator utilizing length mode vibration, which includes a piezoelectric ceramic substrate, and first and second main electrode faces formed on opposite surfaces of the piezoelectric ceramic substrate, and which is characterized in that there is further provided a groove formed in one of the first and second main electrode faces so as to extend over an entire length of the piezoelectric ceramic substrate in a direction parallel to its longitudinal direction, and at a position deviated from a center in a widthwise direction of the piezoelectric ceramic substrate by more than 2% of the width of the piezoelectric ceramic substrate.

3 Claims, 5 Drawing Figures

RECTANGULAR PIEZOELECTRIC RESONATOR WITH OFFSET SLOT

BACKGROUND OF THE INVENTION

The present invention generally relates to a piezoelectric resonator and more particularly, to an improved strip type or rectangular type piezoelectric resonator for use, for example, in oscillators, electrical filters and the like.

With the recent progress in the field of integrated circuits, inexpensive ceramic resonators have been widely utilized for the actual applications, and normally, disc type or rectangular plate type piezoelectric resonators are generally employed for the purpose in a range of resonance frequencies from 100 KHZ up to 1 MHZ so as to utilize the expansion mode of vibration thereof.

As shown in FIG. 1, the known rectangular plate type piezoelectric resonator referred to above includes, for example, a piezoelectric ceramic substrate 1, main electrode faces 2 and 3 formed on the opposite surfaces of said piezoelectric ceramic substrate 1, and lead wires 4 respectively connected to said main electrode faces 2 and 3. However, in the rectangular plate type piezoelectric resonator as described above or disc type piezoelectric resonator conventionally employed, there have been such disadvantages that they are generally large in size, and moreover, tend to produce spurious waves due to thickness mode vibration based on the fundamental wave.

Meanwhile, as shown in FIG. 2, there has also been conventionally available a strip type piezoelectric resonator utilizing length mode vibration based on the fundamental wave, and having a construction generally similar to that of the rectangular plate type piezoelectric resonator in FIG. 1 as represented by like reference numerals. Although advantageous in that the dimensions are reduced as compared with the rectangular plate type or disc type piezoelectric resonator, the conventional strip type piezoelectric resonator as described above still has disadvantages in that undesirable spurious responses due to width mode vibration and thickness mode vibration tend to be produced.

SUMMARY OF THE INVENTION

Accordingly, an essential object of the present invention is to provide an improved strip type piezoelectric resonator in which undesirable spurious responses due to width mode vibration and thickness mode vibration are suppressed by forming a groove on one of opposite main electrode faces of the resonator, in a direction parallel to the longitudinal direction thereof and at a position deviated from a center in a widthwise direction of a piezoelectric ceramic substrate, with substantial elimination of disadvantages inherent in the conventional piezoelectric resonators of this kind.

Another important object of the present invention is to provide a strip type piezoelectric resonator of the above described type, which is simple in construction and stable in functioning at high reliability, and can be readily manufactured on a large scale at low cost.

In accomplishing these and other objects, according to one preferred embodiment of the present invention, there is provided a strip type piezoelectric resonator utilizing length mode vibration, which includes a piezoelectric ceramic substrate, and first and second main electrode faces formed on opposite surfaces of the piezoelectric ceramic substrate, and is characterized in that there is further provided a groove which is formed in one of the first and second main electrode faces so as to extend over an entire length of the piezoelectric ceramic substrate in a direction parallel to the longitudinal direction thereof, and at a position deviated from a center in a widthwise direction of the piezoelectric ceramic substrate by more than 2% of the width of said piezoelectric ceramic substrate.

By the arrangement according to the present invention as described above, an improved strip type piezoelectric resonator with suppressed spurious responses has been advantageously presented through simple construction.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
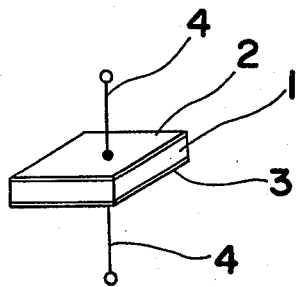
FIG. 1 is a perspective view showing a construction of a conventional rectangular plate type piezoelectric resonator (already referred to)

Before the description of the present invention proceeds, it is to be noted that like parts are designated by like reference numerals throughout the accompanying drawings.

Figure 2:
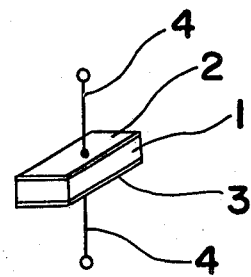
FIG. 2 is a perspective view showing a construction of a conventional strip type piezoelectric resonator (already referred to)
Figure 3:
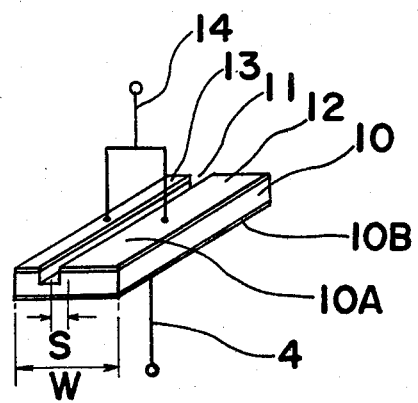
FIG. 3 is a perspective view showing a strip type piezoelectric resonator according to one preferred embodiment of the present invention.

Referring now to the drawings, there is shown in FIG. 3 a strip type piezoelectric resonator according to one preferred embodiment of the present invention, which generally includes a piezoelectric ceramic substrate 10, and upper and lower main electrode faces 10A and 10B formed on opposite surfaces of the substrate 10. In one surface of the piezoelectric ceramic substrate 10 at the side of the upper main electrode face 10A, there is formed a groove 11 which extends over an entire length of the substrate 10 in a direction parallel to the longitudinal direction of said substrate 10 and is located at a position deviated, at its center line in a widthwise direction thereof, from a center line in the widthwise direction of the upper main electrode face 10A or the substrate 10 as illustrated. By the above groove 11, the upper main electrode face 10A of the substrate 10 is divided into a large region 12 and a small region 13, while the lower main electrode face 10B is formed on the other entire surface of the substrate 10 in the similar manner as in the conventional arrangement of FIGS. 1 or 2.

More specifically, by way of example, the piezoelectric ceramic substrate 10 is set in dimensions to be 4.65 mm in length, 0.8 mm in width W, and 0.3 mm in thickness, and the groove 11 has a width of 0.15 mm and a depth of 0.15 mm, while a distance through which the groove 11 is deviated from the center in the widthwise direction of the piezoelectric ceramic substrate 10, i.e. a distance S from the center of the substrate 10 in its widthwise direction to the center of said groove 11 in the widthwise direction thereof is set to be 0.1 mm, and the oscillation frequency of the strip type piezoelectric resonator of FIG. 3 is 400 KHZ when used as an oscillator.

For the actual use of the piezoelectric resonator of FIG. 3 as described so far, the respective regions 12 and 13 on the upper main electrode face 10A divided by the groove 11 are short-circuited to each other so as to be connected to a lead wire 14 for the upper side, while a lead wire 4 is connected to the lower main electrode face 10B in the similar manner as in the conventional arrangement of FIG. 1 or 2, and thus, a two terminal type resonator is constituted.

Figure 4:
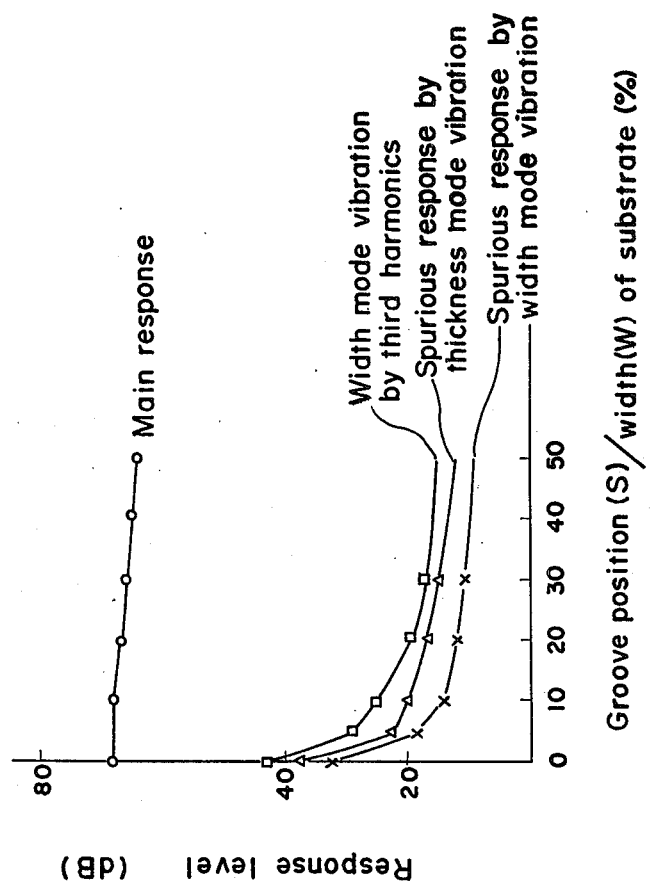
FIG. 4 is a graph showing a state of resonance in the strip type piezoelectric resonator according to the present invention.

Subsequently, in the piezoelectric resonator having the construction as shown in FIG. 3, on the assumption that the distance through which the groove 11 is deviated from the center in the widthwise direction of the piezoelectric ceramic substrate 10 is represented by S, and the width of the piezoelectric ceramic substrate 10 is denoted by W as referred to earlier, measurements were taken on the characteristics thereof, with the value of S/W employed as a parameter. As shown in FIG. 4, response level was represented as a level difference between resonant point and anti-resonant point.

Figure 5:
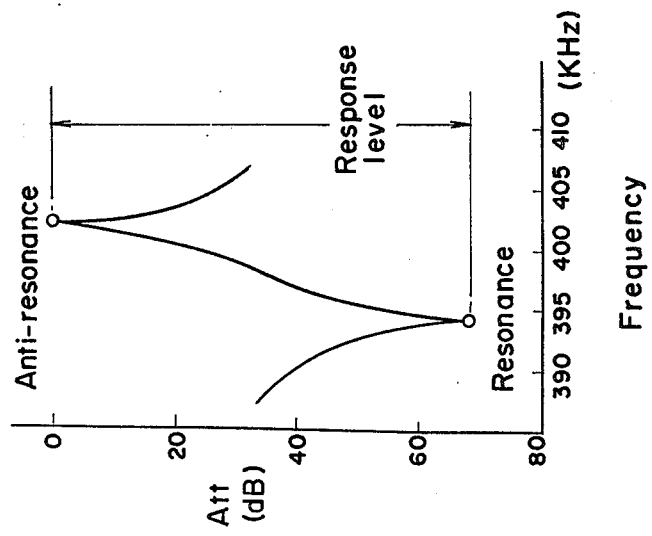
FIG. 5 is a graph showing variations in the characteristics of the strip type piezoelectric resonator according to the present invention when position of the groove is altered.

As a result of the above measurements, it has been found as shown in FIG. 5 that, as the value S/W increases, the main response decreases only slightly, whereas the spurious responses due to width mode vibration by third harmonics (first excited overtone of width mode), and thickness mode vibration and width mode vibration based on the fundamental wave are reduced to a large extent.

Normally, for the spurious oscillation to be suppressed, it is necessary that the spurious responses are reduced to less than half of the main response, and in order to satisfy the above requirement in the result of measurement in FIG. 5, S/W must be larger than 2%. On the other hand, as the position of the groove 11 is gradually spaced or deviated from the center of the piezoelectric ceramic substrate 10, the arrangement for supporting the piezoelectric ceramic substrate 10 may undesirably be complicated, while the strength of the substrate 10 at the region 13 which is narrow in width tends to be reduced, and therefore, the upper limit of S/W should preferably be 30%.

Accordingly, as is seen from the above description, the range for the positional deviation of the groove 11 to be provided in the present invention, from the center in the widthwise direction of the piezoelectric ceramic substrate 10 should be more than 2% of the width of the ceramic substrate 10.

In the arrangement of FIG. 3, although the groove 11 is provided in the upper main electrode face 10A, it is needless to say that such groove 11 may be so modified as to be provided in the lower main electrode face 10B to obtain the same effect.

Moreover, in the foregoing embodiment, even when the dimensions (width and depth) of the groove 11 are altered, results of measurements generally in the similar trend as in those of FIG. 5 have been obtained.

It should be noted here that, although the arrangement of the present invention is prepared as a resonator, it is best suited to applications to an oscillator.

For manufacturing the strip type piezoelectric resonator according to the present invention in an efficient manner, processings may be effected by such steps as forming electrode layers over the entire opposite surfaces, i.e. upper and lower surfaces of a large piezoelectric ceramic plate having a predetermined thickness, subsequently forming grooves each having the predetermined width and depth in one of the electrode formed surfaces at equal intervals, and finally cutting off the large piezoelectric ceramic plate thus processed into dimensions of individual piezoelectric resonators as shown in FIG. 3.

As is clear from the foregoing description, according to the present invention, since the piezoelectric resonator is constituted by forming the groove in one of the main electrode faces of the strip type piezoelectric ceramic substrate in a direction parallel to the longitudinal direction thereof, and at a position deviated by more than 2% of the width of said substrate from the center in the widthwise direction of said piezoelectric ceramic substrate, spurious responses due to width mode vibration and thickness mode vibration may be suppressed to less than 35 dB with respect to the main response of 70 dB, and thus, the piezoelectric resonator free from generation of spurious response has been advantageously presented.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A strip type piezoelectric resonator utilizing length mode vibration, which comprises a piezoelectric ceramic substrate, and first and second main electrode faces formed on opposite surfaces of the piezoelectric ceramic substrate, the improvement comprising a groove which is formed on one of said first and second main electrode faces so as to extend over an entire length of the piezoelectric ceramic substrate in a direction parallel to the longitudinal direction thereof, and at a position deviated from a center in a widthwise direction of the piezoelectric ceramic substrate by more than 2% of the width of said piezoelectric ceramic substrate.

2. A strip type piezoelectric resonator as claimed in claim 1, wherein said piezoelectric ceramic substrate is set to be 4.65 mm in length, 0.8 mm in width and 0.3 mm in thickness, and said groove is set to be 0.15 mm in width and 0.15 mm in depth, said groove being deviated at its center in a widthwise direction thereof, from the center in the widthwise direction of said piezoelectric ceramic substrate by 0.1 mm, said piezoelectric resonator having a frequency at 400 KHZ when used as an oscillator.

3. A strip type piezoelectric resonator as claimed in claim 1, wherein one region and the other region in the one of said first and second main electrode faces divided by said groove are short circuited to each other.

* * * * *